United States Patent [19]
Shimura et al.

[11] Patent Number: 5,889,434
[45] Date of Patent: Mar. 30, 1999

[54] MICROWAVE POWER AMPLIFIER

[75] Inventors: Teruyuki Shimura; Takeshi Miura; Tadashi Takagi, all of Tokyo, Japan

[73] Assignee: Mitsubishi Denki Kabushiki Kaisha, Tokyo, Japan

[21] Appl. No.: 888,543

[22] Filed: Jul. 7, 1997

[30] Foreign Application Priority Data

Nov. 1, 1996 [JP] Japan .................................. 8-291625

[51] Int. Cl.$^6$ ...................................................... H03F 3/191
[52] U.S. Cl. ............................................. 330/302; 330/310
[58] Field of Search ..................................... 330/149, 285, 330/296, 300, 310, 302, 304, 305, 306, 133

[56] References Cited

U.S. PATENT DOCUMENTS

| | | | |
|---|---|---|---|
| 5,051,706 | 9/1991 | Zushi ...................................... | 330/306 |
| 5,250,912 | 10/1993 | Fujita ...................................... | 330/285 |
| 5,493,255 | 2/1996 | Murtojarvi .............................. | 330/296 |
| 5,745,857 | 4/1998 | Maeng et al. ........................... | 330/310 |

FOREIGN PATENT DOCUMENTS

| | | |
|---|---|---|
| 3104422 | 5/1991 | Japan . |
| 405308233 A | 11/1993 | Japan ..................................... 330/302 |
| 5315550 | 11/1993 | Japan . |

OTHER PUBLICATIONS

Ogura et al., "Simple Linearizer Using Si–Bipolar Transistor", 1993 Spring Conference of the Institute of Electronics, Information and Communication Engineers, p. 2–523.

Nakayama et al., "A Novel Amplitude And Phase Linearizing Technique For Microwave Power Amplifiers", 1995 IEEE MTT–S Digest, pp. 1451–1454.

Yamauchi et al., "A Novel Series Diode Linearizer For Mobile Radio Power Amplifiers", 1996 IEEE MTT–S Digest, pp. 831–834.

*Primary Examiner*—Robert Pascal
*Assistant Examiner*—Khanh V. Nguyen
*Attorney, Agent, or Firm*—Leydig, Voit & Mayer

[57] ABSTRACT

A microwave power amplifier having n stages (n is an integer of at least two), which uses bipolar transistors as amplifying elements. Grounded electrodes, bias applying methods, and bias values of the bipolar transistors of the respective stages are set so that phase rotations of output powers of bipolar transistors of m stages (m is an integer of $1 \leq m \leq n-1$) among the n stages are canceled by phase rotation of at least one of the other bipolar transistors of the (n–m) stages. Therefore, the total phase rotation of the power amplifier can be neutralized, resulting in a microwave power amplifier having excellent distortion characteristics.

17 Claims, 4 Drawing Sheets

MICROWAVE POWER AMPLIFIER

FIELD OF THE INVENTION

The present invention relates to a microwave power amplifier that employs bipolar transistors as amplifying elements and, more particularly, to a microwave power amplifier having excellent distortion characteristics.

BACKGROUND OF THE INVENTION

A microwave high power amplifier employed for a digital mobile telephone or the like requires low distortion characteristics for avoiding adjacent channel interference. To improve the distortion characteristics, phase rotation and gain compression of input/output signals of a transistor used for the power amplifier should be suppressed.

In a prior art high power microwave power amplifier, in order to compensate phase rotation and gain compression, caused by the characteristics of a o n transistor used as an amplifying element, a diode, an FET, or a bipolar transistor is inserted in a stage before the transistor.

In addition, usually in a high power and high efficiency two-stage amplifier which requires excellent distortion characteristics, an element of the first stage is employed in a linear region, i.e., a region having low distortion, that is, having less gain compression and less phase rotation, and an element of the second stage improves output power and power added efficiency in a range where the standard of distortion is satisfied. In the prior art microwave power amplifier, in order that the element of the first stage have an increased linear region and the element of the second stage satisfy the standard of distortion, the sizes of the respective elements are made larger.

In the prior art microwave power amplifier, another element is inserted in a stage before the transistor in order to compensate the phase rotation and gain compression, so that the number of parts is increased, resulting in a cost increase.

In the prior art microwave power amplifier, the sizes of the elements are made larger for fabricating a high power two-stage amplifier which requires excellent distortion characteristics, so that the whole circuit becomes larger in size, resulting in a cost increase and difficulty in realizing high efficiency.

SUMMARY OF THE INVENTION

It is an object of the present invention to provide a microwave power amplifier in which distortion characteristics are improved without increasing the number of parts.

Another object of the present invention is to provide a high power and high efficiency two-stage amplifier that has excellent distortion characteristics with suppressed enlargement of the element size.

Other objects and advantages of the present invention will become apparent from the detailed description given hereinafter; it should be understood, however, that the detailed description and specific embodiments are given by way of illustration only, since various changes and modifications within the scope of the invention will become apparent to those skilled in the art from this detailed description.

According to a first aspect of the present invention, in a microwave power amplifier having an n-stage (n is an integer larger than one) structure which uses bipolar transistors as amplifying elements, grounded electrodes, bias applying methods, and bias values applied to the bipolar transistors of the respective stages are set so that phase rotation of output powers of bipolar transistors of the m stages (m is an integer, $1 \leq m \leq n-1$), among the n stages, are canceled by phase rotation of output power of at least one of the bipolar transistors of the (n–m) stages. Therefore, the total phase rotation of the power amplifier can be suppressed, resulting in a microwave power amplifier having excellent distortion characteristics.

According to a second aspect of the present invention, in a microwave power amplifier having an n-stage (n is an integer larger than one) structure which uses bipolar transistors as amplifying elements, grounded electrodes, bias applying methods, and bias values applied to the bipolar transistors of the respective stages are set so that gain changes of bipolar transistors of the m stages (m is an integer, $1 \leq m \leq n-1$), among the n stages, with respect to input powers are canceled by a gain change of at least one of the bipolar transistors of the (n–m) stages. Therefore, the total gain of the power amplifier can be maintained flat in a range where the input power is higher, resulting in a microwave power amplifier having excellent distortion characteristics.

According to a third aspect of the present invention, in the microwave power amplifier of the first aspect of the invention, all of the bipolar transistors of the respective stages have one of a grounded emitter and a grounded base, and the bipolar transistors of the m stages are operated in a base current constant mode and the bipolar transistors of the (n–m) stages are operated in a base voltage constant mode. Therefore, the total phase rotation of the power amplifier can be suppressed, resulting in a microwave power amplifier having excellent distortion characteristics.

According to a fourth aspect of the present invention, in the microwave power amplifier of the third aspect of the invention, the base-emitter voltages of the bipolar transistors operated in a base voltage constant mode are set to a voltage to operate the bipolar transistors in one of class-AB, close to class-B, operation to class-C operation, and the base currents of the bipolar transistors operated in a base current constant mode are set so that the collector currents operate the bipolar transistors in one of class-A operation and class-AB operation in a small signal region. Therefore, the total phase rotation of the power amplifier can be suppressed and the total gain of the power amplifier can be maintained flat in a range where the input power is higher, resulting in a microwave power amplifier having excellent distortion characteristics.

According to a fifth aspect of the present invention, in the microwave power amplifier of the third aspect of the invention, the base currents of the bipolar transistors operated in the base current constant mode are set so that the collector currents operate the bipolar transistors in class-AB, close to class-B, operation in a small signal region, and the base-emitter voltages of the bipolar transistors operated in the base voltage constant mode are set to operate the bipolar transistors in one of class-A operation and class-AB operation. Therefore, the total phase rotation of the power amplifier can be suppressed and the total gain of the power amplifier can be maintained flat in a range where the input power is higher, resulting in a microwave power amplifier having excellent distortion characteristics.

According to a sixth aspect of the present invention, in the microwave power amplifier of the second aspect of the invention, all of the bipolar transistors of the respective stages are operated in a base voltage constant mode, and the base-emitter voltages of the bipolar transistors of the m stages are set to operate the bipolar transistors in one of class-AB, close to class-B, operation to class-C operation and the base-emitter voltages of the bipolar transistors of the (n–m) stages are set to such a voltage as to operate in one of class-A operation and class-AB operation. Therefore, the total gain of the power amplifier can be maintained flat in a range where the input power is higher, resulting in a microwave power amplifier having excellent distortion characteristics.

According to a seventh aspect of the present invention, in the microwave power amplifier of the second aspect of the invention, all of the bipolar transistors of the respective stages are operated in a base current constant mode, and the base currents of the bipolar transistors of the m stages are set so that the collector currents operate the bipolar transistors in class-AB, close to class-B, operation in a small signal region and the base currents of the bipolar transistors of the (n–m) stages are set so that the collector currents operate those bipolar transistors in one of class-A operation and class-AB operation in a small signal region. Therefore, the total gain of the power amplifier can be maintained flat in a range where the input power is higher, resulting in a microwave power amplifier having excellent distortion characteristics.

According to an eighth aspect of the present invention, in the microwave power amplifier of the first aspect of the invention, all of the bipolar transistors of the respective stages are operated in one of base voltage and base current constant modes, and the bipolar transistors of the m stages have a grounded base, and the bipolar transistors of the (n–m) stages have a grounded emitter. Therefore, the total phase rotation of the power amplifier can be suppressed, resulting in a microwave power amplifier having excellent distortion characteristics.

According to a ninth aspect of the present invention, in the microwave power amplifier of the eighth aspect of the invention, all of the bipolar transistors of the respective stages are operated in a base voltage constant mode, and the base-emitter voltages of the bipolar transistors of the m stages are set to operate the bipolar transistors in one of class-AB, close to class-B, operation to class-C operation and the base-emitter voltages of the bipolar transistors of the (n–m) stages are set to a voltage to operate in one of class-A operation and class-AB operation. Therefore, the total phase rotation of the power amplifier can be suppressed and the total gain of the power amplifier can be maintained flat in a range where the input power is higher, resulting in a microwave power amplifier having excellent distortion characteristics.

According to a tenth aspect of the present invention, in the microwave power amplifier of the eighth aspect of the invention, all of the bipolar transistors of the respective stages are operated in a base current constant mode, and the base currents of the bipolar transistors of the m stages are set so that the collector currents operate the bipolar transistors in class-AB, close to class-B, operation in a small signal region and the base currents of the bipolar transistors of the (n–m) stages are set so that the collector currents operate those bipolar transistors in one of class-A operation and class-AB operation in a small signal region. Therefore, the total phase rotation of the power amplifier can be suppressed and the total gain of the power amplifier can be maintained flat in a range where the input power is higher, resulting in a microwave power amplifier having excellent distortion characteristics.

According to an eleventh aspect of the present invention, in the microwave power amplifier of the second aspect of the invention, the bipolar transistors of m stages are operated in a base voltage constant mode and the bipolar transistors of the (n–m) stages are operated in a base current constant mode, the base-emitter voltages of the bipolar transistors operated in a base voltage constant mode are set to a voltage to operate in one of class-AB, close to class-B, operation to class-C operation, and the base currents of the bipolar transistors operated in a base current constant mode are set so that the collector currents operate the bipolar transistors in one of class-A operation and class-AB operation in a small signal region. Therefore, the total gain of the power amplifier can be maintained flat in a range where the input power is higher, resulting in a microwave power amplifier having excellent distortion characteristics.

According to a twelfth aspect of the present invention, in the microwave power amplifier of the second aspect of the invention, the bipolar transistors of the m stages operated in a base voltage constant mode and the bipolar transistors of the (n–m) stages are operated in a base current constant mode, the base currents of the bipolar transistors operated in a base current constant mode are set so that the collector currents operate the bipolar transistors in class-AB, close to class-B, operation in a small signal region, and the base-emitter voltages of the bipolar transistors operated in a base voltage constant mode are set to operate the bipolar transistors in one of class-A operation and class-AB operation. Therefore, the total gain of the power amplifier can be maintained flat in a range where the input power is higher, resulting in a microwave power amplifier having excellent distortion characteristics.

According to a thirteenth aspect of the present invention, in the microwave power amplifier of the second aspect of the invention, the bipolar transistors of the m stages are operated in a base voltage constant mode and the bipolar transistors of the (n–m) stages are operated in a base current constant mode, the base-emitter voltages of the bipolar transistors of k stages (k is an integer of $1 \leq k \leq m$) are set to operate the bipolar transistors in one of class-AB, close to class-B, operation to class-C operation, and the bipolar transistors of the (n–m) stages and at least one of the bipolar transistors of the (m–k) stages, among the m stages, are set to operate the bipolar transistors in one of class-A operation and class-AB operation. Therefore, the total gain of the power amplifier can be maintained flat in a range where the input power is higher, resulting in a microwave power amplifier with a structure of three or more stages and having excellent distortion characteristics.

According to a fourteenth aspect of the present invention, in the microwave power amplifier of the second aspect of the invention, the bipolar transistors of the m stages are operated in a base current constant mode and the bipolar transistors of the (n–m) stages are operated in a base voltage constant mode, the base currents of the bipolar transistors of k stages (k is an integer of $1 \leq k \leq m$), among the m stages, are set so that the collector currents operate the bipolar transistors in class-AB, close to class-B, operation in a small signal region, and the bipolar transistors of the (n–m) stages and at least one of the bipolar transistors of (m–k) stages, among the m stages, are set to operate the bipolar transistors in one of class-A operation and class-AB operation. Therefore, the total gain of the power amplifier can be maintained flat in a range where the input power is higher, resulting in a microwave power amplifier with a multiple stage structure of three stages or more and having excellent distortion characteristics.

According to a fifteenth aspect of the present invention, in the microwave power amplifier of the second aspect of the invention, all of the bipolar transistors of the respective stages are operated in a base voltage constant mode, the bipolar transistors of the m stages have a grounded emitter and the bipolar transistors of the (n–m) stages have a grounded base, the base-emitter voltages of the bipolar transistors of k stages (k is an integer of $1 \leq k \leq m$) are set to operate the bipolar transistors in one of class-AB, close to class-B, operation to the bipoperation, and the bipolar transistors of the (n–m) stages and at least one of the bipolar transistors of the (m–k) stages are set to operate the bipolar transistors in one of class-A operation and class-AB operation. Therefore, the total gain of the power amplifier can be maintained flat in a range where the input power is higher, resulting in a microwave power amplifier with three or more stages and having excellent distortion characteristics.

According to a sixteenth aspect of the present invention, in the microwave power amplifier of the second aspect of the invention, all of the bipolar transistors of the respective stages are operated in a base current constant mode, the bipolar transistors of the m stages have a grounded emitter and the bipolar transistors of the (n–m) stages have a grounded base, the base currents of the bipolar transistors of k stages (k is an integer of $1 \leq k \leq m$), among the m stages, are set so that the collector currents operate the bipolar transistors in class-AB, close to class-B, operation in a small signal region, and the bipolar transistors of the (n–m) stages and at least one of the bipolar transistors of the (m–k) stages, among the m stages, are set to operate the bipolar transistors in one of class-A operation and class-AB operation in a small signal region. Therefore, the total gain of the power amplifier can be maintained flat in a range where the input power is higher, resulting in a microwave power amplifier with three or more stages and having excellent distortion characteristics.

According to a seventeenth aspect of the present invention, in the microwave power amplifier of the first aspect of the invention serving as a microwave power amplifier having a two-stage structure, the bipolar transistor of the first stage is operated in a base current constant mode, and the bipolar transistor of the second stage is operated in a base voltage constant mode. Therefore, it is possible to easily construct a two-stage amplifier with high power and high efficiency which has excellent distortion characteristics without making the sizes of the amplifying elements larger.

According to an eighteenth aspect of the present invention, in the microwave power amplifier of the first aspect of the invention serving as a microwave power amplifier having an n-stage (n is an integer larger than two) structure, the bipolar transistor of the first stage is operated in a base current constant mode, and the bipolar transistor of the final stage is operated in a base voltage constant mode. Therefore, it is possible to construct easily a multiple stage amplifier with high power and high efficiency that has excellent distortion characteristics without making the sizes of the amplifying elements larger.

DETAILED DESCRIPTION OF THE PREFERRED EMBODIMENTS

Embodiment 1

Figure 1:
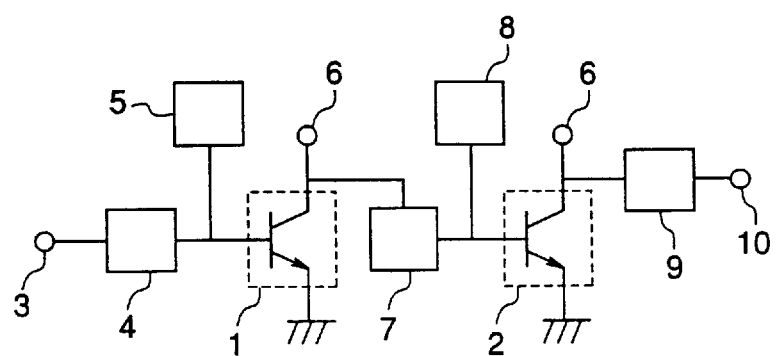
FIG. 1 is a circuit diagram illustrating a microwave power amplifier in accordance with a first embodiment of the present invention.

FIG. 1 is a circuit diagram illustrating a microwave power amplifier according to a first embodiment of the present invention. In the figure, reference numeral 1 designates a bipolar transistor of the first stage between an input terminal and an interstage matching circuit (hereinafter referred to as a first bipolar transistor), numeral 2 designates a bipolar transistor of the second stage between an output terminal and an interstage matching circuit (hereinafter referred to as a second bipolar transistor), and numeral 3 designates an RF input terminal. Reference numeral 4 designates an input matching circuit of the first bipolar transistor 1 that determines input impedance. Reference numeral 5 designates a constant current source, numeral 6 designates a supply voltage terminal, numeral 7 designates an interstage matching circuit, and numeral 8 designates a constant voltage source. Reference numeral 9 designates an output matching circuit of the second bipolar transistor 2 that determines output impedance. Reference numeral 10 designates an RF output terminal.

Figure 2:
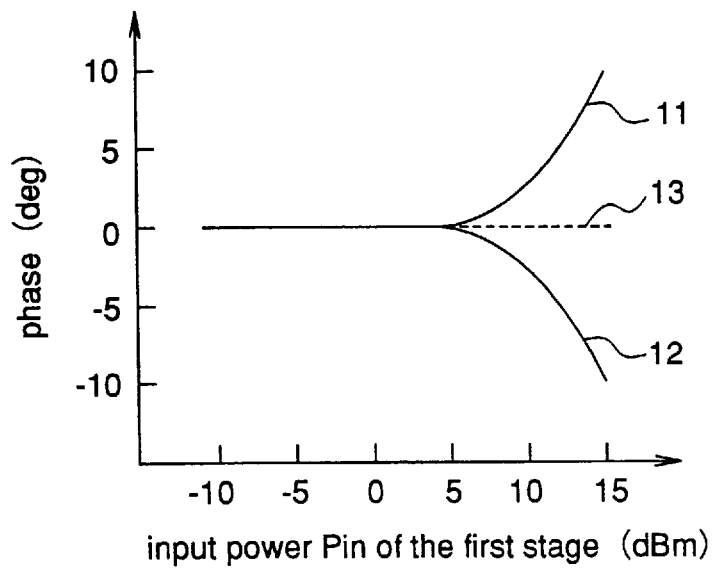
FIG. 2 is a diagram showing a relationship between input power and phase of the microwave power amplifier according to the first embodiment of the invention.

FIG. 2 is a diagram for explaining the effects of the microwave power amplifier according to the first embodiment of the invention. In the figure, reference numeral 11 designates phase rotation of output power of the first bipolar transistor 1 with respect to input power ($P_{in}$), numeral 12 designates phase rotation of output power of the second bipolar transistor 2 with respect to the input power ($P_{in}$), and numeral 13 designates the total phase rotation of output power of the power amplifier with respect to the input power ($P_{in}$).

A description is given of the operation. In the microwave power amplifier according to the first embodiment of the invention, the first bipolar transistor 1 is operated in a base current ($I_B$) constant mode and the second bipolar transistor 2 is operated in a base voltage ($V_B$) constant mode. When a bipolar transistor is operated in the $I_B$ constant mode, by appropriately setting input and output impedances, especially the input impedance, its phase rotates in a positive direction for a wide range of impedances. More specifically, by appropriately adjusting the input and output impedances, the phase of the first bipolar transistor 1 rotates a signal in a positive direction as the input power ($P_{in}$) increases.

Meanwhile, when a bipolar transistor is operated in the $V_B$ constant mode, by appropriately setting input and output impedances, especially the input impedance, the phase of a signal is rotated in a negative direction over a wide range of the impedances. More specifically, by appropriately adjusting the input and output impedances, the second bipolar transistor 2 rotates the phase in a negative direction when the input power ($P_{in}$) increases.

Accordingly, as shown in FIG. 2, the phase 11 of the first bipolar transistor 1 is rotated in a positive direction and the phase 12 of the second bipolar transistor 2 is rotated in a negative direction, so that the phase rotations cancel to realize the total phase 13 of the power amplifier, i.e., the state in which the phase of the output power ($P_{out}$) of the second stage does not rotate at all with respect to the phase of the input power ($P_{in}$) of the first stage.

In the microwave power amplifier according to the first embodiment, i.e., a microwave power amplifier having a two-stage structure which uses bipolar transistors as amplifying elements, both of the first and second bipolar transistors have a grounded emitter, the first bipolar transistor 1 is operated in the $I_B$ constant mode, and the second bipolar transistor 2 is operated in the $V_B$ constant mode. Therefore, the phase rotation produced in the first stage is canceled by the phase rotation produced in the second stage, whereby the total phase rotation of the power amplifier can be suppressed, resulting in a microwave power amplifier having excellent distortion characteristics.

Although in the first embodiment of the invention the first bipolar transistor is operated in the $I_B$ constant mode and the second bipolar transistor is operated in the $V_B$ constant mode, the first bipolar transistor may be operated in the $V_B$ constant mode and the second bipolar transistor may be operated in the $I_B$ constant mode. Also in this case, the phase rotation produced in the first stage is canceled by the phase rotation produced in the second stage, whereby the distortion characteristics of the power amplifier are improved. When a two-stage amplifier of high power and high efficiency, which requires excellent distortion characteristics, is constructed, it is more advantageous to use a structure in which the first bipolar transistor operates in the $I^B$ constant mode and the second bipolar transistor operates in the a $V_B$ constant mode.

Figure 3:
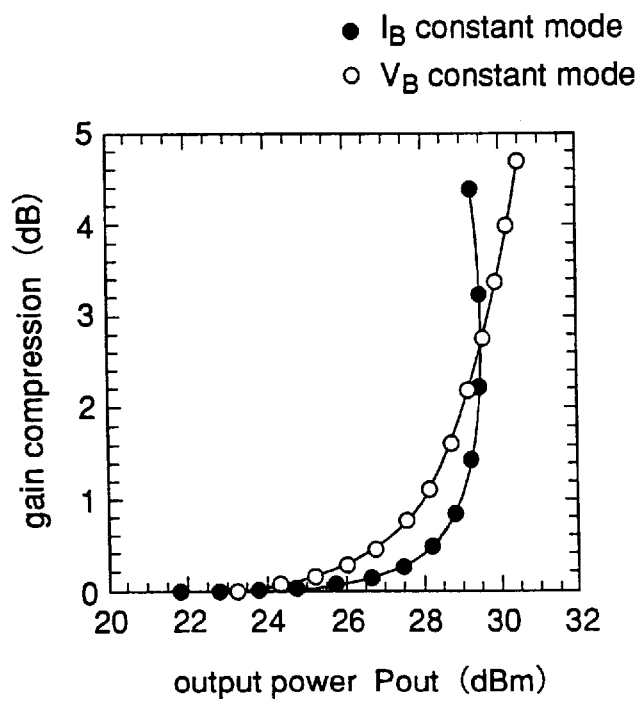
FIG. 3 is a graph showing gain compression when a bipolar transistor is operated in two bias modes, i.e., an $I_B$ constant mode and a $V_B$ constant mode.
Figure 4:
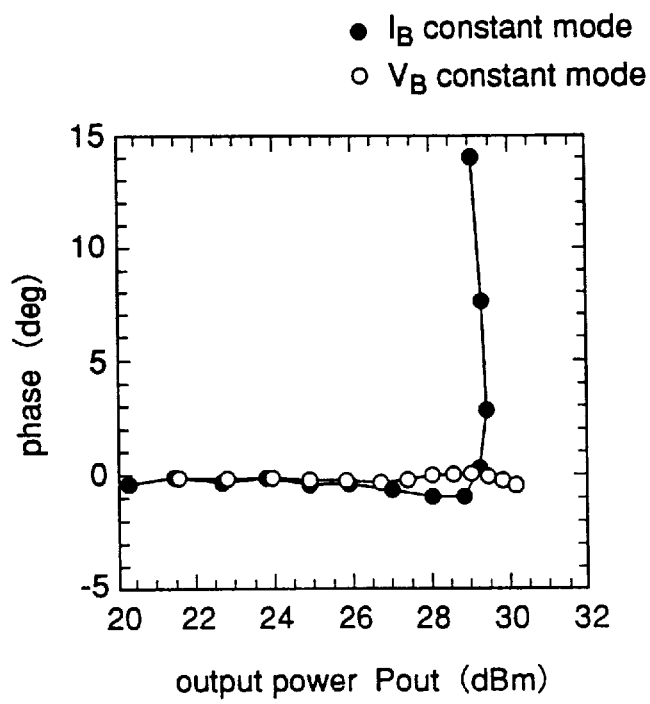
FIG. 4 is a graph showing phases when a bipolar transistor is operated in two bias modes, i.e., an $I_B$ constant mode and a $V_B$ constant mode.

A description is given of the further effect when the first bipolar transistor is operated in the $I_B$ constant mode and the second bipolar transistor is operated in the $V_B$ constant mode. FIG. 3 is a graph showing gain compression when a bipolar transistor is operated in two bias modes, i.e., the $I_B$ constant mode and the $V_B$ constant mode. In the figure, the abscissa shows output power ($P_{out}$). Black circles represent the gain compression under the $I_B$ constant mode operation, and white circles represent the gain compression in the $V_B$ constant mode operation. FIG. 4 is a graph showing phase rotation when a bipolar transistor is operated in two bias modes, i.e., the $I_B$ constant mode and the $V_B$ constant mode. In the figure, the abscissa shows output power ($P_{out}$), as shown in FIG. 3. Black circles represent the phase rotation in the $I_B$ constant mode operation, and white circles represent the phase rotation in the $V_B$ constant mode operation.

The data shown in FIGS. 3 and 4 are measured by operating an identical device (emitter size: 4×40 $\mu m^2$ ×40 pieces) in two bias modes, i.e., the $I_B$ constant mode and the $V_B$ constant mode, respectively. In these measurements, the bias collector current is 480 mA and the collector voltage ($V_{CE}$) is 3.4 V. As is found from FIG. 3, when the output power ($P_{out}$) is 29 dBm or less, the gain compression in the $I_B$ constant mode operation is suppressed.

Usually, in a two-stage amplifier with high power and high efficiency which requires excellent distortion characteristics, an element of the first stage is employed for a linear region, i.e., a region having low distortion, that is, having less gain compression and less phase rotation, and an element of the second stage improves output power and power added efficiency in a range where the distortion specification is satisfied.

As is known from FIG. 4, when the output power ($P_{out}$) is 29 dBm or less, the phases in the two bias modes hardly rotate. Therefore, in a two-stage amplifier using bipolar transistors, the element of the first stage should be operated in the $I_B$ constant mode.

Figure 5:
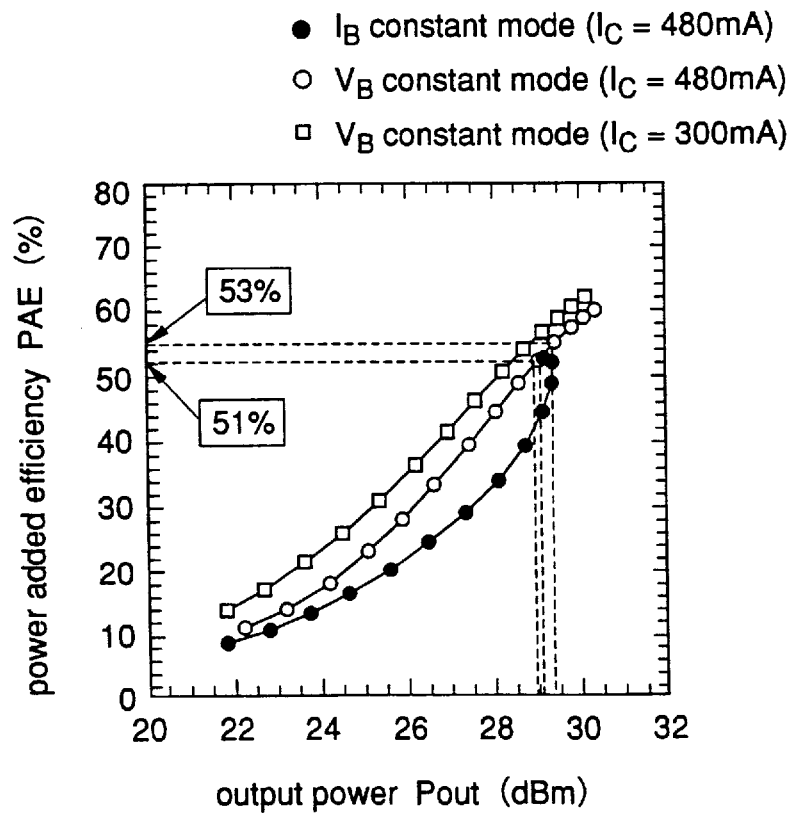
FIG. 5 is a graph showing power added efficiency (PAE) when a bipolar transistor is operated in two bias modes, i.e., an $I_B$ constant mode and a $V_B$ constant mode.

FIG. 5 is a graph showing power added efficiency (PAE) when a bipolar transistor is operated in two bias modes, i.e., an $I_B$ constant mode and a $V_B$ constant mode. In the figure, the abscissa shows output power ($P_{out}$), and the ordinate shows power added efficiency. Black circles represent the power added efficiency in the $I_B$ constant mode operation and a bias collector current $I_C$ of 480 mA, white circles represent the power added efficiency in the $V_B$ constant mode operation and a bias collector current $I_C$ of 480 mA, and white squares represent the power added efficiency in the $V_B$ constant mode operation and a bias collector current $I_C$ of 300 mA. The structure of the device measured and the collector voltage ($V_{CE}$) are the same as shown in FIGS. 3 and 4.

When the value of distortion is standardized (the standard value is ACP (adjacent channel power) ≤−48 dBc), as shown by dotted lines in FIG. 5, in the case where the bias $I_C$ is 480 mA, the PAE in the $I_B$ and $V_B$ constant modes is 51%. In the case where the bias $I_C$ is 300 mA, the output power hardly decreases and the PAE at the $V_B$ constant mode increases to 53%. Further, at all the output levels, the PAE in the $V_B$ constant mode is higher than the PAE in the $I_B$ constant mode. Therefore, the element of the second stage in which the efficiency is important is better operated in the $V_B$ constant mode than in the $I_B$ constant mode.

In the microwave power amplifier according to the first embodiment of the invention, the first bipolar transistor is operated in the $I_B$ constant mode and the bipolar transistor is operated in the $V_B$ constant mode. Therefore, it is possible to obtain the further effect that a two-stage amplifier with high power, high efficiency, and that requires excellent distortion characteristics is constructed easily, without making the sizes of amplifying elements larger.

Embodiment 2

A description is given of a microwave power amplifier according to a second embodiment of the present invention. The microwave power amplifier according to the second embodiment includes bipolar transistors having a two-stage structure. In the first bipolar transistor that is operated in the $V_B$ constant mode, the base-emitter voltage ($V_{BE}$) is made low to operate the first bipolar transistor in any of class-AB, close to class-B, operation to class-C operation. In the second bipolar transistor that is operated in a $V_B$ constant mode, the $V_{BE}$ is set to a normal bias voltage to operate the second bipolar transistor in class-A operation or class-AB operation. The specific circuit structure is realized by changing the constant current source 5 of the microwave power amplifier of the first embodiment, shown in FIG. 1, to a constant voltage source.

Figure 6:
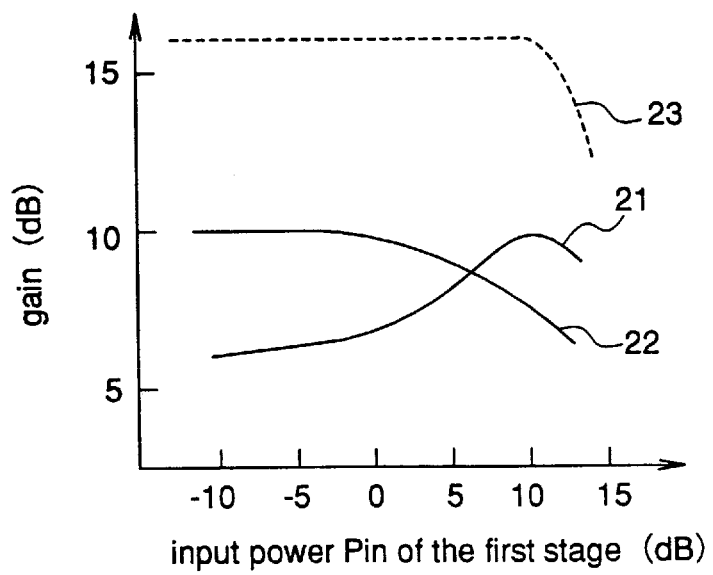
FIG. 6 is a diagram showing a relationship between input power and gain of a microwave power amplifier in accordance with a second embodiment of the present invention.

FIG. 6 is a diagram for explaining the effects of the microwave power amplifier according to the second embodiment of the invention. In the figure, reference numeral 21 designates gain change of the first bipolar transistor 1 with respect to input power ($P_{in}$), numeral 22 designates gain change of the second bipolar transistor 2 with respect to the input power ($P_{in}$), and numeral 23 designates the total gain change of the power amplifier with respect to the input power ($P_{in}$).

An AlGaAs/GaAs HBT (heterojunction bipolar transistor) is used as an example of the bipolar transistor. In order to maintain linearity of gain, the AlGaAs/GaAs HBT is operated with a base-emitter voltage ($V_{BE}$) of about −1.35 V. In the second embodiment of the invention, the $V_{BE}$ of the HBT 1 of the first stage is made lower, for example, about −1.25

V. When the HBT 1 of the first stage is operated with the lower $V_{BE}$ the gain of the HBT 1 increases with an increase of the input power ($P_{in}$) as shown by a curved line 21 in FIG. 6. When the HBT 2 of the second stage is operated with the $V_{BE}$ of −1.35 V, the gain of the HBT 2 is linear in a range where $P_{in}$ is low and decreases with an increase of $P_{in}$ as shown by a curved line 22 in FIG. 6.

Accordingly, by appropriately selecting the $V_{BE}$ of the first and second bipolar transistors, the total gain of the power amplifier can be maintained flat in a range where the $P_{in}$ is higher as shown in FIG. 6.

In a microwave power amplifier according to the second embodiment, i.e., a microwave power amplifier having a two-stage structure which uses bipolar transistors, both of the first and second bipolar transistors are operated in a base voltage constant mode, the base-emitter voltage of the first bipolar transistor is set to operate the first bipolar transistor in any of class-AB, close to class-B, operation to class-C operation, and the base-emitter voltage of the second bipolar transistor is set to operate the second bipolar transistor in class-A operation or class-AB operation. Therefore, the gain changes in the first and second stages with respect to the input power compensate for each other, whereby the total gain of the power amplifier can be maintained flat in a range where the input power is higher, resulting in a microwave power amplifier having excellent distortion characteristics.

Although in the second embodiment of the invention the first bipolar transistor is operated with the lower $V_{BE'}$, −1.25 V, and the second bipolar transistor is operated with the normal $V_{BE'}$, −1.35 V, the first bipolar transistor may be operated with the normal $V_{BE'}$, −1.35 V, and the second bipolar transistor may be operated with the lower $V_{BE'}$, −1.25 V. In this case, the same effects as in the second embodiment are obtained.

In the second embodiment of the invention, both of the first and second bipolar transistors are operated in the base voltage constant mode. However, both of the first and second bipolar transistors may be operated in the base current constant mode, the base current of one bipolar transistor may be set so that the collector current of the bipolar transistor operates the bipolar transistor in class-AB, close to class-B, operation in a small signal region, and the base current of the other bipolar transistor may be set so that the collector current of the other bipolar transistor operates in class-A operation or class-AB operation in a small signal region. For example, the case where an AlGaAs/GaAs HBT is used as the bipolar transistor is considered. The base current $I_B$ of the first bipolar transistor is set so that its collector current $I_C$ is 0 to ⅒×saturation current ($I_{CS}$). The saturation current ($I_{CS}$) is defined as emitter area (cm$^{-2}$) ×10$^5$ A/cm$^2$. The base current $I_B$ of the second bipolar transistor is set to operate the second bipolar transistor in class-A operation or class-AB operation. Since the first bipolar transistor is set so that its collector current $I_C$ is 0 to ⅒×saturation current ($I_{CS}$), it is operated in class-AB, close to class-B, operation and the gain increases with an increase of the input power ($P_{in}$). Because the second bipolar transistor is operated in class-A operation or class-AB operation, the gain is linear in a range where the $P_{in}$ is low and decreases with an increase of the $P_{in}$. Therefore, similar to the microwave power amplifier according to the second embodiment, the gain changes in the first and second stages with respect to the input power compensate for each other, whereby the total gain of the power amplifier remains flat in a range where the $P_{in}$ increases, resulting in a microwave power amplifier having excellent distortion characteristics.

Embodiment 3

A description is given of a microwave power amplifier according to a third embodiment of the present invention. The microwave power amplifier according to the third embodiment includes bipolar transistors having a two-stage structure. The first bipolar transistor is operated in the $I_B$ constant mode and the second bipolar transistor is operated in the $V_B$ constant mode. In the first bipolar transistor operated in the $I_B$ constant mode, the base current is set so that the bipolar transistor operates in class-AB, close to class-B, operation in a small signal region. In the second bipolar transistor operated in the $V_B$ constant mode, the $V_{BE}$ is set to a normal bias voltage to operate the second bipolar transistor in class-A operation or class-AB operation. The specific circuit structure is the same as the structure of the microwave power amplifier shown in FIG. 1 according to the first embodiment. For example, considering the case where AlGaAs/GaAs HBTs are used as the bipolar transistors, the second bipolar transistor is operated in a $V_{BE}$×1.35 V constant mode and the $I_B$ of the first bipolar transistor is adjusted to be $I_C$=0 to ⅒×saturation current ($I_{CS}$).

In the microwave power amplifier according to the third embodiment, the first bipolar transistor is operated in the $I_B$ constant mode and the second bipolar transistor is operated in the $V_B$ constant mode. Therefore, the phase rotation produced in the first stage is canceled by the phase rotation produced in the second stage, whereby the total phase rotation of the power amplifier can be suppressed. Further, the base current of the first bipolar transistor that is operated in the $I_B$ constant mode is set so that the bipolar transistor operates in class-AB, close to class-B, operation in a small signal region, and the $V_{BE}$ of the second bipolar transistor that is operated in the $V_B$ constant mode is set to a normal bias voltage to operate the second bipolar transistor in class-A operation or class-AB operation. Accordingly, the gain changes in the first and second stages with respect to the input power compensate for each other, whereby the total gain of the power amplifier remains flat as the input power increases. Consequently, in the microwave power amplifier according to the third embodiment, the effect shown in FIG. 2 according to the first embodiment and the effect shown in FIG. 6 according to the second embodiment can be simultaneously realized, resulting in a microwave power amplifier having extremely low distortion.

Although in the third embodiment of the invention the $I_C$ of the first bipolar transistor is narrowed in the $I_B$ constant mode and the normal bias is applied to the second bipolar transistor in the $V_B$ constant mode, the normal bias may be applied to the first bipolar transistor in the $V_B$ constant mode and the $I_C$ of the second bipolar transistor may be narrowed in the $I_B$ constant mode. In this case, the same effects as in the third embodiment are obtained.

In the third embodiment of the invention, the bipolar transistor operated in the $I_B$ constant mode is operated in class-AB, close to class-B, operation. However, the base current of the bipolar transistor operated in the $I_B$ constant mode may be set to a normal bias, i.e., to operate the bipolar transistor in class-A operation or class-AB operation in a small signal region, and the base voltage of the bipolar transistor operated in the $V_B$ constant mode may be set to operate the bipolar transistor in any of class-AB, close to class-B, operation to class-C operation. In this case, the effect shown in FIG. 2 according to the first embodiment and the effect shown in FIG. 6 according to the second embodiment can be simultaneously realized, resulting in a microwave power amplifier having extremely low distortion.

Embodiment 4

Figure 7:
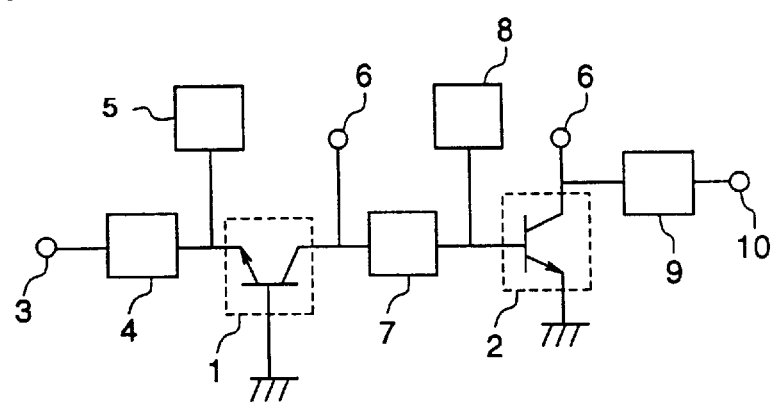
FIG. 7 is a circuit diagram illustrating a microwave power amplifier in accordance with a fourth embodiment of the present invention.

FIG. 7 is a circuit diagram illustrating a microwave power amplifier according to a fourth embodiment of the present invention. In the figure, the same reference numerals as those shown in FIG. 1 designate the same or corresponding parts. In the microwave power amplifier according to the fourth embodiment, both of the first and second bipolar transistors are operated in the $V_B$ constant mode, and the first bipolar transistor 1 has a grounded base and the second bipolar transistor 2 has a grounded emitter.

In the first to third embodiments of the invention, both of the first and second bipolar transistors have a grounded emitter. In the fourth embodiment, however, the first bipolar transistor 1 has a grounded base and the second bipolar transistor 2 has a grounded emitter. For example, in the case of AlGaAs/GaAs HBTs, the $V_{BE}$ of the first bipolar transistor is -1.35 V and the $V_{BE}$ of the second bipolar transistor is 1.35 V.

When the bipolar transistor having the grounded base is operated in the $V_B$ constant mode, it is possible to have a positive phase rotation for a wide range of input impedances, as when the bipolar transistor having the grounded emitter is operated in the $I_B$ constant mode. Accordingly, the microwave power amplifier of the fourth embodiment has the same effects as those obtained in the first embodiment in which both of the first and second bipolar transistors have a grounded emitter, and the first bipolar transistor is operated in the $I_B$ constant mode and the second bipolar transistor is operated in the $V_B$ constant mode.

As described above, in the microwave power amplifier according to the fourth embodiment, i.e., the microwave power amplifier having a two-stage structure which uses bipolar transistors as amplifying elements, both of the first and second bipolar transistors are operated in the base voltage constant mode. The first bipolar transistor 1 has a grounded base and the second bipolar transistor 2 has a grounded emitter. Therefore, the phase rotation produced in the first stage is canceled by the phase rotation produced in the second stage, whereby the total phase rotation of the power amplifier can be suppressed, resulting in a microwave power amplifier having excellent distortion characteristics.

Although in the fourth embodiment the first bipolar transistor 1 has a grounded base and the second bipolar transistor 2 has a grounded emitter, the first bipolar transistor 1 may have a grounded emitter and the second bipolar transistor 2 may have a grounded base. In this case, the same effects as in the fourth embodiment are obtained.

In the fourth embodiment of the invention, both of the first and second bipolar transistors are operated in the $V_B$ constant mode. However, both of the first and second bipolar transistors may be operated in the $I_B$ constant mode. In this structure, the bipolar transistor having the grounded base is operated in the $I_B$ constant mode. When the bipolar transistor having the grounded base is operated in the $I_B$ constant mode, a negative phase rotation is produced for a wide range of the input impedances, as when the bipolar transistor having the grounded emitter is operated in the $V_B$ constant mode. Therefore, in this structure, the phase rotation produced in the first stage is canceled by the phase rotation produced in the second stage, whereby the total phase rotation of the power amplifier can be suppressed, resulting in a microwave power amplifier having excellent distortion characteristics.

Embodiment 5

A description is given of a microwave power amplifier according to a fifth embodiment of the present invention. In the microwave power amplifier according to the fifth embodiment, which is fundamentally identical to the microwave power amplifier shown in FIG. 7 according to the fourth embodiment, the absolute value of the $V_{BE}$ of the first bipolar transistor 1 having the grounded base, i.e., the minus value, is made smaller, the voltage of the first bipolar transistor 1 is set to a value to operate the bipolar transistor in any of class-AB, close to class-B, operation to class-C operation, and the $V_{BE}$ of the second bipolar transistor 2 having the grounded emitter is set to a normal bias voltage to operate the bipolar transistor in class-A operation or class-AB operation. Specifically, taking an AlGaAs/GaAs HBT as an example, the $V_{BE}$ of the first bipolar transistor is -1.25 V (constant), and the $V_{BE}$ of the second bipolar transistor is -1.35 V (constant).

By using the structure described above, besides the effect obtained in the fourth embodiment, the effect obtained in the second embodiment is produced, i.e., gain changes in the first and second stages with respect to the input power compensate for each other, so that the total gain of the power amplifier remains flat in a range where the input power increases. Thereby, a microwave power amplifier having excellent distortion characteristics is realized.

Although in the fifth embodiment the absolute value of the $V_{BE}$ of the first bipolar transistor 1 is made smaller, the $V_{BE}$ of the second bipolar transistor 2 may be made smaller. Although in the fifth embodiment the first bipolar transistor 1 has a grounded base and the second bipolar transistor 2 has a grounded emitter, the first bipolar transistor 1 may have the grounded emitter and the second bipolar transistor 2 may have the grounded base.

In the fifth embodiment of the invention, both of the first and second bipolar transistors are operated in the base voltage constant mode, and the absolute value of the $V_{BE}$ of one bipolar transistor is made smaller. However, both of the first and second bipolar transistors may be operated in the base current constant mode. The base current of one bipolar transistor may be set so that the bipolar transistor operates in class-AB, close to class-B, operation in a small signal region, and the base current of the other bipolar transistor may be set so that the other bipolar transistor operates in class-A operation or class-AB operation in a small signal region. The same effects as in the fifth embodiment are obtained.

In the fifth embodiment of the invention, both of the first and second bipolar transistors are operated in the base voltage constant mode. However, one bipolar transistor may be operated in the base voltage constant mode and the other bipolar transistor may be operated in a base current constant mode. The $V_{BE}$ of the bipolar transistor operated in the base voltage constant mode is set to a voltage to operate the bipolar transistor in any of class-AB, close to class-B, operation to class-C operation, and the bipolar transistor operated in the base current constant mode is set to a normal bias to operate the bipolar transistor in class-A operation or class-AB operation in a small signal region, or the base current of the bipolar transistor operated in the base current constant mode is set so that the bipolar transistor operates in class-AB, close to class-B, operation in a small signal region, and the bipolar transistor operated in the a base voltage constant mode operates in class-A operation or class-AB operation. In this case, while the phase rotations produced in the first and second stages are not canceled, the gains of the first and second stages are compensated.

Embodiment 6

A description is given of a microwave power amplifier according to a sixth embodiment of the present invention. The microwave power amplifier according to the sixth embodiment includes bipolar transistors having a two-stage structure. Both of the first and second bipolar transistors have a grounded base, and the first (second) bipolar transistor is operated in the $I_B$ constant mode and the second (first) bipolar transistor is operated in the $V_B$ constant mode.

As described above, when the bipolar transistor having a grounded base is operated in the $V_B$ constant mode, the phase rotates in the positive direction over a wide range of input impedances, as when the bipolar transistor having a grounded emitter is operated in the $I_B$ constant mode. Meanwhile, when the bipolar transistor having the grounded base is operated in the $I_B$ constant mode, it is possible to make the phase rotation negative over a wide range of input impedances, as when the bipolar transistor having the grounded emitter is operated in the $V_B$ constant mode. Therefore, in the microwave power amplifier of the sixth embodiment, as in the first embodiment, in which both of the first and second bipolar transistors have a grounded emitter, and one bipolar transistor is operated in the $I_B$ constant mode and the other bipolar transistor is operated in the $V_B$ constant mode, the phase rotation in the first stage is canceled by the phase rotation produced in the second stage, whereby the total phase rotation of the power amplifier can be suppressed, resulting in a microwave power amplifier having excellent distortion characteristics.

Embodiment 7

A description is given of a microwave power amplifier according to a seventh embodiment of the present invention. The microwave power amplifier according to the seventh embodiment includes bipolar transistors having a two-stage structure, both of the first and second bipolar transistors have a grounded base, and the first (second) bipolar transistor is operated in the $I_B$ constant mode and the second (first) bipolar transistor is operated in the $V_B$ constant mode. Further, the $V_{BE}$ of the bipolar transistor operated in the $V_B$ constant mode is set to operate the bipolar transistor in any of class-AB, close to class-B, operation to class-C operation, and the bipolar transistor operated in the $I_B$ constant mode is set to a normal bias to operate the bipolar transistor in class-A operation or class-AB operation in a small signal region, or the $I_B$ of the bipolar transistor operated in the $I_B$ constant mode is set so that the collector current of the bipolar transistor operates in the class-AB, close to class-B, operation in a small signal region, and the bipolar transistor operated in the $V_B$ constant mode is set to a normal bias to operate the bipolar transistor in class-A operation or class-AB operation.

Using the structure described above, besides the effect obtained in the sixth embodiment, the effect obtained in the second embodiment is produced, i.e., the gain changes in the first and second stages with respect to the input power compensate for each other, so that the total gain of the power amplifier is maintained flat as the input power increases. Thereby, a microwave power amplifier having excellent distortion characteristics is realized.

In the seventh embodiment of the invention, the first (second) bipolar transistor is operated in the $I_B$ constant mode and the second (first) bipolar transistor is operated in the $V_B$ constant mode. However, both of the first and second bipolar transistors may be operated in the $V_B$ constant mode or in the $I_B$ constant mode. In this case, while the phase rotations produced in the first and second stages are not canceled, the gains obtained in the first and second stages are compensated.

Embodiment 8

Microwave power amplifiers having two-stage structures are described as the first to seventh embodiments of the invention. The present invention is applicable to a microwave power amplifier having three or more stages.

As is known from the respective embodiments described above, when the bipolar transistor of each stage is operated, the bipolar transistor has a grounded base or a grounded emitter, and is operated in the $I_B$ constant mode or in the $V_B$ constant mode. That is, there are four patterns of combining these stages. Therefore, if the numbers of stages of a microwave power amplifier is n (n is an integer of more than two), $4^n$ combinations of circuits are conceivable. However, all of the combinations do not have the effect of canceling the phase rotations, and the combinations require that at least one of the n stages be different from the other stages in phase rotation direction.

Specifically, in a microwave power amplifier having an n-stage structure, it is necessary that all of bipolar transistors of the respective stages have a grounded emitter or all of them have a grounded base, and the bipolar transistors of the m stages (m is an integer and $1 \leq m \leq n-1$), among the n stages, be operated in the base current constant mode and the bipolar transistors of the (n–m) stages be operated in the base voltage constant mode. Or, in a microwave power amplifier having an n-stage structure, all of the bipolar transistors of the respective stages must be operated in the base voltage constant mode or all of them must be operated in the base current constant mode, and the bipolar transistors of the m stages among the n stages have a grounded base and the bipolar transistors of the (n–m) stages have a grounded emitter. Using the structure described above, the desired phase rotations are obtained, thereby realizing a microwave power amplifier with a structure of three or more stages having excellent distortion characteristics.

When the bias of a bipolar transistor of at least one of the n stages is set so that the gain of the bipolar transistor increases with respect to the $P_{in}$, it is possible to compensate gain changes. More specifically, by using any of the following structures, the effect of compensating the gain changes is obtained, thereby realizing a microwave power amplifier with a structure of three or more stages having excellent distortion characteristics:

i) in a microwave power amplifier having an n-stage structure, all of bipolar transistors of the respective stages are operated in the base voltage constant mode, the base-emitter voltages of the bipolar transistors of the m stages, among the n stages, are set to operate the bipolar transistors of the m stages in any of class-AB, close to class-B, operation to class-C operation, and the base-emitter voltages of the other bipolar transistors of (n–m) stages are set to operate the other bipolar transistors of the (n–m) stages in class-A operation or class-AB operation.

ii) in a microwave power amplifier having an n-stage structure, all of bipolar transistors of the respective stages are operated in the base current constant mode, the base currents of the bipolar transistors of the m stages, among the n stages, are set so that the bipolar transistors operate in class-AB, close to class-B, operation, and the base currents of the bipolar transistors of the (n–m) stages are set to operate in class-A operation or class-AB operation.

iii) in a microwave power amplifier having an n-stage structure, bipolar transistors of the m stages, among the n stages, are operated in the base voltage constant mode, the bipolar transistors of the (n–m) stages are operated in the base current constant mode, the base-emitter voltages of the bipolar transistors of k stages (k is an integer, $1 \leq k \leq m$), among the m stages, are set to operate the bipolar transistors of the k stages in any of class-AB, close to class-B, operation to class-C operation, and the bipolar transistors of the (n–m) stages and at least one of the bipolar transistors of the (m–k) stages, among the m stages, are set to operate the bipolar transistors in class-A operation or class-AB operation.

iv) in a microwave power amplifier having an n-stage structure, bipolar transistors of the m stages, among the n stages, are operated in the base current constant mode, the bipolar transistors of the (n–m) stages are operated in the base voltage constant mode, the base currents of the bipolar transistors of the k stages, among the m stages, are set so that the bipolar transistors operate in class-AB, close to class-B, operation in a small signal region, and the bipolar transistors of (n–m) stages and at least one of the bipolar transistors of the (m–k) stages, among the m stages, are set to operate the bipolar transistors in class-A operation or class-AB operation.

v) in a microwave power amplifier having an n-stage structure, all of bipolar transistors of the respective stages are operated in a base voltage constant mode, the bipolar transistors of the m stages, among the n stages, have a grounded emitter and the bipolar transistors of the (n–m) stages have a grounded base, the base-emitter voltages of the bipolar transistors of the k stages, among the m stages, operate the bipolar transistors of the k stages in any of class-AB, close to class-B, operation to class-C operation, and the bipolar transistors of (n–m) stages and at least one of the bipolar transistors of the (m–k) stages are set to operate the bipolar transistors in class-A operation or class-AB operation.

vi) in a microwave power amplifier having an n-stage structure, all of bipolar transistors of the respective stages are operated in a base current constant mode, the bipolar transistors of the m stages, among the n stages, have a grounded emitter and the bipolar transistors of the (n–m) stages have a grounded base, the base currents of the bipolar transistors of the k stages, among the m stages, are set so that the bipolar transistors operate in class-AB, close to class-B, operation in a small signal region, and the bipolar transistors of (n–m) stages and at least one of the bipolar transistors of the (m–k) stages, among the m stages, are set to operate the bipolar transistors in class-A operation or class-AB operation in a small signal region.

Further, by combining the structures having the effect of canceling the phase rotations with the structures i) to vi) having the effect of compensating gain changes, it is possible to realize a microwave power amplifier with three or more stages, canceling phase rotations and compensating gain changes.

Furthermore, when in a microwave power amplifier with an n-stage structure, the first bipolar transistor is operated in a base current constant mode and the bipolar transistor of the final stage is operated in a base voltage constant mode, a multiple stage amplifier with high power output and high efficiency, which has excellent distortion characteristics, is easily constructed without making the sizes of the amplifying elements larger, as described for the first embodiment.

What is claimed is:

1. A microwave power amplifier comprising:

an n-stage (n is an integer larger than 1) structure and using bipolar transistors as amplifying elements in which grounded electrodes, biasing methods, and biases applied to the bipolar transistors are set so that phase rotations of outputs of the bipolar transistors of m stages (m is an integer and $1 \leq m \leq n-1$) are cancelled by a phase rotation of an output of at least one of the bipolar transistors of (n–m) stages wherein:

all of the bipolar transistors of the respective stages have one of a grounded emitter and a grounded base; and the bipolar transistors of the m stages are operated in a base current constant mode and the bipolar transistors of the (n–m) stages are operated in a base voltage constant mode.

2. The microwave power amplifier of claim 1 wherein:

base-emitter voltages of the bipolar transistors operated in a base voltage constant mode are set to a voltage to operate the bipolar transistors under one of class-AB, close to class-B, operation to class-C operation; and base currents of the bipolar transistors operated in a base current constant mode are set so that the bipolar transistors operate under one of class-A operation and class-AB operation in a small signal region.

3. The microwave power amplifier of claim 1 wherein:

base currents of the bipolar transistors operated in a base current constant mode are set so that the bipolar transistors operate under class-AB, close to class-B, operation in a small signal region; and base-emitter voltages of the bipolar transistors operated in a base voltage constant mode are set to a voltage to operate the bipolar transistors under one of class-A operation and class-AB operation.

4. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:

all of the bipolar transistors of the respective stages are operated in a base voltage constant mode; and base-emitter voltages of the bipolar transistors of the m stages are set to a voltage to operate the bipolar transistors under one of class-AB, close to class-B, operation to class-C operation and the base-emitter voltages of the other bipolar transistors of the (n–m) stages are set to a voltage to operate the other bipolar transistors under one of class-A operation and class-AB operation.

5. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:

all of the bipolar transistors of the respective stages are operated in a base current constant mode; and base currents of the bipolar transistors of the m stages are set so that collector currents operate the bipolar transistors under class-AB, close to class-B, operation in a small signal region and the base currents of the bipolar transistors of the (n–m) stages are set so that the other bipolar transistors operate under one of class-A operation and class-AB operation in a small signal region.

6. A microwave power amplifier comprising:

an n-stage (n is an integer larger than 1) structure and using bipolar transistors as amplifying elements in which grounded electrodes, biasing methods, and biases applied to the bipolar transistors are set so that phase rotations of outputs of the bipolar transistors of m stages (m is an integer and $1 \leq m \leq n-1$) are cancelled by a phase rotation of an output of at least one of the bipolar transistors of (n–m) stages wherein:
   all of the bipolar transistors of the respective stages are operated in one of base voltage and base current constant mode; and
   the bipolar transistors of the m stages have grounded bases and the bipolar transistors of the (n–m) stages have grounded emitters.

7. The microwave power amplifier of claim 6 wherein:
all of the bipolar transistors of the respective stages are operated in a base voltage constant mode; and
base-emitter voltages of the bipolar transistors of the m stages are set to a voltage as to operate the bipolar transistors under one of class-AB, close to class-B, operation to class-C operation, and base-emitter voltages of the other bipolar transistors of the (n–m) stages are set to a voltage to operate the other bipolar transistors under one of class-A operation and class-AB operation.

8. The microwave power amplifier of claim 6 wherein:
all of the bipolar transistors of the respective stages are operated in a base current constant mode; and
base currents of the bipolar transistors of the m stages are set so that collector currents operate the bipolar transistors in class-AB, close to class-B, operation in a small signal region and base currents of the other bipolar transistors of the (n–m) stages are set so that the collector currents operate the other bipolar transistors in one of class-A operation and class-AB operation in a small signal region.

9. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:
   the bipolar transistors of the m stages are operated in a base voltage constant mode and the bipolar transistors of the (n–m) stages are operated in a base current constant mode;
   base-emitter voltages of the bipolar transistors operated in a base voltage constant mode are set to operate the bipolar transistors in one of class-AB, close to class-B, operation to class-C operation; and
   base currents of the bipolar transistors operated in a base current constant mode are set so that the bipolar transistors operate in one of class-A operation and class-AB operation in a small signal region.

10. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:
   the bipolar transistors of the m stages are operated in a base voltage constant mode and the bipolar transistors of the (n–m) stages are operated in a base current constant mode;
   base currents of the bipolar transistors operated in a base current constant mode are set so that the bipolar transistors operate in class-AB, close to class-B, operation in a small signal region; and
   base-emitter voltages of the bipolar transistors operated in a base voltage constant mode are set to operate the bipolar transistors in one of class-A operation and class-AB operation.

11. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:
   the bipolar transistors of the m stages are operated in a base voltage constant mode and the bipolar transistors of the (n–m) stages are operated in a base current constant mode;
   base-emitter voltages of the bipolar transistors of k stages (k is an integer and $1 \leq k \leq m$) are set to a voltage to operate the bipolar transistors under one of class-AB, close to class-B, operation to class-C operation; and
   the bipolar transistors of the (n–m) stages and at least one of the bipolar transistors of the (m–k) stages are set to a bias to operate the bipolar transistors under one of class-A and class-AB operation.

12. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:
   the bipolar transistors of the m stages are operated in a base current constant mode and the bipolar transistors of the (n–m) stages are operated in a base voltage constant mode;
   base currents of the bipolar transistors of k stages (k is an integer and $1 \leq k \leq m$) are set so that the bipolar transistors operate under class-AB, close to class-B, operation in small signal regions; and
   the bipolar transistors of the (n–m) stages and at least one of the bipolar transistors of the (m–k) stages are set to a bias to operate the bipolar transistors operate under one of class-A and class-AB operation.

13. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:

all of bipolar transistors of the respective stages are operated in a base voltage constant mode;

the bipolar transistors of the m stages have grounded emitters and the bipolar transistors of the (n–m) stages have grounded bases;

base-emitter voltages of the bipolar transistors of k stages (k is an integer and $1 \leq k \leq m$) are set to operate the bipolar transistors in one of class-AB, close to class-B, operation to class-C operation; and the bipolar transistors of the (n–m) stages and at least one of the bipolar transistors of the (m–k) stages are set to a bias to operate the bipolar transistors in one of class-A operation and class-AB operation.

14. A microwave power amplifier comprising:

an n-stage (n is an integer larger than 1) structure and using bipolar transistors as amplifying elements in which grounded electrodes, biasing methods, and biases applied to the bipolar transistors are set so that gain changes of the bipolar transistors of m stages (m is an integer and $1 \leq m \leq n-1$) with respect to input powers are cancelled by a gain change of at least one of the bipolar transistors of (n–m) stages wherein:

all of the bipolar transistors of the respective stages are operated in a base current constant mode;

the bipolar transistors of the m stages have grounded emitters and the bipolar transistors of the (n–m) stages have grounded bases;

base currents of the bipolar transistors of k stages (k is an integer and $1 \leq k \leq m$) are set so that the bipolar transistors operate in class-AB, close to class-B, operation in a small signal region; and the bipolar transistors of the (n–m) stages and at least one of the bipolar transistors of the (m–k) stages are set to a bias to operate the bipolar transistors in one of class-A operation and class-AB operation in a small signal region.

15. A microwave power amplifier comprising:

n-stage (n is an integer larger than 1) structure using bipolar transistors as amplifying elements in which grounded electrodes, biasing methods, and biases applied to the bipolar transistors are set so that phase rotations of outputs of the bipolar transistors of m stages (m is an integer and $1 \leq m \leq n-1$) are cancelled by a phase rotation of an output of at least one of the bipolar transistors of (n–m) stages wherein:

the bipolar transistor of a first stage is operated in a base current constant mode; and the bipolar transistor of a final stage is operated in a base voltage constant mode.

16. The microwave power amplifier of claim 15 wherein n is 2 and the final stage is the second stage of the amplifier.

17. The microwave power amplifier of claim 15 wherein n is at least 3.

\* \* \* \* \*

UNITED STATES PATENT AND TRADEMARK OFFICE
CERTIFICATE OF CORRECTION

PATENT NO. : 5,889,434
DATED : March 30, 1999
INVENTOR(S) : SHIMURA et al.

It is certified that error appears in the above-identified patent and that said Letters Patent is hereby corrected as shown below:

Column 17, line 22, delete "as".

Column 20, line 11, before "n-stage" insert --an--.

Signed and Sealed this

Twenty-eighth Day of September, 1999

*Attest:*

Q. TODD DICKINSON

*Attesting Officer*     *Acting Commissioner of Patents and Trademarks*